United States Patent
Nakayama

(10) Patent No.: US 6,587,983 B1
(45) Date of Patent: Jul. 1, 2003

(54) APPARATUS AND METHOD OF TESTING A SEMICONDUCTOR DEVICE

(75) Inventor: Hiroyasu Nakayama, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/541,911

(22) Filed: Apr. 3, 2000

(30) Foreign Application Priority Data

Apr. 2, 1999 (JP) .......................................... 11-095744

(51) Int. Cl.$^7$ ............................................... G01R 31/28
(52) U.S. Cl. ....................................... 714/736; 714/738
(58) Field of Search ............................... 714/729, 732, 714/736, 738, 819, 820, FOR 101

(56) References Cited

U.S. PATENT DOCUMENTS

| 5,142,223 | A |   | 8/1992 | Higashino et al. ...... 324/158 R |
| 5,646,948 | A | * | 7/1997 | Kobayashi et al. ......... 714/719 |
| 5,673,271 | A | * | 9/1997 | Ohsawa ...................... 714/718 |
| 6,202,186 | B1 | * | 3/2001 | Oonk ........................... 714/738 |

FOREIGN PATENT DOCUMENTS

| JP | 59-217297 | 12/1984 | ........... G11C/29/00 |

OTHER PUBLICATIONS

German Office Action dated Dec. 11, 2002, 4 pages.
Patent Abstracts of Japan, Publication No.: 59217297, Publication Date: Dec. 7, 1984, 1 page.

* cited by examiner

Primary Examiner—Albert Decady
Assistant Examiner—Matthew C. Dooley
(74) Attorney, Agent, or Firm—Rosenthal & Osha L.L.P.

(57) ABSTRACT

Semiconductor device testing apparatus and method for testing a semiconductor device, includes: a pattern generator (10) which, based on a predetermined control sequence, generates an input signal pattern (12) and an expectation data signal pattern (14); a comparison unit (90) which compares an output signal pattern output from the semiconductor device and the expectation data signal pattern, and outputs a match signal when the output signal is matched with predetermined data determined based on the expectation data signal pattern. The pattern generator (10) includes: a stoppage unit which stops the control sequence when the match signal does not become active during a predetermined match cycle; a resuming address register which sets up a resuming address indicating a resuming position of the control sequence; and a resuming unit which resumes the control sequence based on the resuming address.

18 Claims, 13 Drawing Sheets

Fig. 11A

ADDRESS COMMAND

| | |
|---|---|
| #0000 | PATTERN APPLIED |
| #0020 | PATTERN APPLIED |
| #0021 | REPEAT LOOP 100 TIMES<br><br>MATCH CYCLE |
| #0030 | JUMP TO #0021 |
| #0031 | PATTERN APPLIED |
| #0050 | PATTERN APPLIED |
| #0051 | REPEAT LOOP 100 TIMES<br><br>MATCH CYCLE |
| #0060 | JUMP TO #0051 |
| #0061 | ⋮ |

Fig. 11B

PIN 1 2 3 ············ 3132

| | | |
|---|---|---|
| INPUT SIGNAL PATTERN 1 | EXPECTATION SIGNAL PATTERN 1 | TEST 1 |
| PNO101 | × × × × × × | |
| PNO101 | × × × × Ⓛ × | |
| PNO101 | × × × × × × | |
| INPUT SIGNAL PATTERN 2 | EXPECTATION SIGNAL PATTERN 2 | TEST 2 |
| PNO101 | × × × × × × | |
| PNO101 | × × × × Ⓛ × | |
| PNO101 | × × × × × × | |
| ⋮ | ⋮ | |

…

APPARATUS AND METHOD OF TESTING A SEMICONDUCTOR DEVICE

This patent application claims priority based on a Japanese patent application, H11-95744 filed on Apr. 2, 1999, the contents of which are incorporated herein by reference.

BACKGROUND OF THE INVENTION

1. Field of the Invention

The present invention relates to a semiconductor device testing apparatus and method for testing the semiconductor device and in particular to the semiconductor testing apparatus capable of resuming a control sequence from a predetermined address after the control sequence for a test is once stopped.

2. Description of the Related Art

FIG. 1 is a block diagram showing the structure of a pattern generator 10 in a typical semiconductor device testing apparatus. The pattern generator 10 is comprised of a match-fail detecting unit 20, a sequence control unit and a pattern data memory 50. Each component of the pattern generator 10 is controlled by a control unit 210, and receives a clock signal output from a reference clock generator 60.

The semiconductor device testing apparatus is used for testing logic ICs such as a system LSI, and can test a plurality of semiconductor devices simultaneously.

The pattern generator 10 generates, according to a predetermined control sequence, an input signal pattern that is to be input to a semiconductor device under test, and an expectation data pattern 14 that is expected to be output from the semiconductor device in the event that the input signal pattern 12 is input to the semiconductor device.

The input signal pattern 12 and the expectation data pattern 14 are stored in a pattern data memory 50. The sequence control unit 40 outputs an address signal 45 to the pattern data memory 50 so as to generate the input signal pattern 12 and the expectation data signal pattern 14. Moreover, the sequence control unit 40 receives a match signal 96 indicating whether or not the output signal pattern output from the semiconductor device is matched with a desired value determined based on the expectation data signal pattern 14. The match-fail detecting unit 20 outputs to the sequence control unit 40 a match-fail signal 22 when the match-fail detecting unit 20 does not receive the match signal 96 during a match cycle waiting for the match signal 96.

The sequence control unit 40 is comprised of a pattern counter 42, an address counter 44 and a control sequence, and a controller 46. The pattern counter 42 counts a match cycle while the address counter 44 counts the address of the control sequence. The controller 46 controls the pattern counter 42 and the address counter 44 according to a predetermined control sequence, and outputs a match cycle signal indicating of being in the midst of match cycle, to the match fail detecting unit 20, and receives the match-fail signal 22 output from the match-fail detecting unit 20. Moreover, upon receipt of the match-fail signal 22 the controller 46 outputs a clock control signal 48 serving to stop generation of clock signals by the reference clock generator 60.

When the controller 46 receives the match signal 96 during the match cycle, the controller 46 controls the pattern counter 42 and the address counter 44 so as to continue the control sequence. On the other hand, upon receipt of the match-fail signal 22 the controller 46 controls the pattern counter 42 and the address counter 44 so that the control sequence is stopped, and performs a fail stop process so as to output the clock control signal 48. The testing is stopped by the fail stop process, thus the testing has to be started over in order to resume the test.

When testing a plurality of semiconductor devices simultaneously, the test is performed while confirming whether or not the write of the input signal pattern 12 to and readout of the output signal pattern from all the semiconductor devices are properly completed. Therefore, a series of several different types of testing procedures are divided accordingly and the completion of the read-write of each semiconductor device 200 are confirmed during a fixed period of time between these testing procedures called the match cycle (this is called a match performance). When the match is not performed during the match cycle, it means that at least one of the plural semiconductor devices under test is defective, so that the defective device is removed from the test after the test is stopped and thereafter the test will be resumed.

FIG. 2 is a flow chart showing a process of testing a single semiconductor device using the conventional semiconductor device testing apparatus. In a test 1 (S102), the input pattern 12 is input to the semiconductor device. Thereafter, when in the match cycle (S104) the output signal pattern output from the semiconductor device is matched with a desired value determined based on the expectation data signal pattern 14 (that is, when the match is performed), the performance of a test 2 will continue in a sequel. When the output signal pattern is not matched with the desired value (that is, when the match is not performed), the test is terminated at once as being a match fail. The same process is carried out in the match cycle after the test 2 (S106). When a test 3 (S110) is performed, all the test processes are completed.

FIG. 3 is a flow chart showing a process simultaneously testing a plurality of semiconductor devices using the conventional semiconductor device testing apparatus. After performing a test 1 (S152), when a match is performed in the match cycle (S154), a test 2 (S156) will continue. However, when the match is not performed, the test is terminated at once as being the match fail (S162). After the test is stopped, the semiconductor device having caused the match fail is removed from testing objects. Then, when the test is performed on the remaining devices, the test 1 is started all over (S152). If the match is not performed then, the test is terminated. Thereafter, the same process is carried out (S162, S164) in the match cycle (S158) after the test 2 (S156). When a test 3 (S110) is performed, all the test processes are completed.

FIG. 4 is a timing chart of an example compared to the present embodiment, showing a process for simultaneously testing a plurality of semiconductor devices using the semiconductor device testing apparatus. After a test 1 (S202) is performed, the match is performed on a plurality of semiconductor devices in the match cycle (S204). If any single match fail is caused, then the test for all devices are stopped (S206). Thereafter, a semiconductor device having caused the match fail is removed from the testing objects (S208), and the test 1 is started from the outset on the other remaining semiconductor devices (S210). Thereafter, the test 1 (S210), test 2 (S214) and test 3 (S218) are performed in this order, and all testing processes will be completed if no match fail occurs in each match cycle (S212, S216).

In the conventional practice of simultaneously testing a plurality of semiconductor devices, the test of all semiconductor devices is stopped when any single match fail occurs in the semiconductor devices in the match cycle, and then the semiconductor device having caused the match fail is removed from the testing objects. Moreover, in order to complete the test of the remaining semiconductor devices the test has to be started all over from the beginning. Thus, this does not result in reducing the testing time even though a plurality of semiconductor devices are simultaneously tested.

Moreover, in the course of testing the semiconductor device such as a system LSI having a flash memory built therein, a re-start of the test after an temporal stoppage of the test caused by the match fail may lead to an excessive write to the flash memory by as much as the overlapped process of the same testing process, thus possibly damaging the device. As a result, the test may not proceed further.

Moreover, when the semiconductor device such as the system LSI having a built-in PLL device (phase lock loop device) is tested, the PLL need be locked by continuously inputting a clock for a certain period of time prior to the start of the test. Thereby, whenever the test is resumed for the remaining semiconductor devices, waiting time until the PLL is locked is necessary, thus causing difficulty in that the test can not be re-started at once.

SUMMARY OF THE INVENTION

Therefore, it is an object of the present invention to provide semiconductor device testing apparatus and method therefor which overcome the above issues in the related art. This object is achieved by combinations described in the independent claims. The dependent claims define further advantageous and exemplary combinations of the present invention.

According to one aspect of the present invention, there is provided semiconductor device testing apparatus for testing a semiconductor device, comprising: a pattern generator which, based on a predetermined control sequence, generates an input signal pattern that is to be input to the semiconductor device, and an expectation data signal pattern that is expected to be output from the semiconductor device with the input signal pattern having been input to the semiconductor device; a comparison unit which compares an output signal pattern output from the semiconductor device and the expectation data signal pattern, and outputs a match signal in the event that the output signal is matched with predetermined data determined based on the expectation data signal pattern. Moreover, the pattern generator includes: a stoppage unit which stops the control sequence in the event that a match fail in which the match signal does not become active during a predetermined cycle is caused; a resuming address register which sets up a resuming address indicating a resuming position of the control sequence; and a resuming unit which resumes the control sequence based on the resuming address.

The pattern generator may further comprises: a pattern data memory which stores data of the input signal pattern and the expectation data signal pattern; and a sequence control unit which generates the input signal pattern and the expectation data signal pattern by supplying an address signal to the pattern data memory, and stops an output of the address signal and thereafter resumes the output of the address signal based on the resuming address set by the resuming address register in the event of the match fail caused.

Preferably, the sequence control unit includes a fail-hold processing unit for performing a fail-hold process which stops an output of the address signal and an input of the input signal pattern to the semiconductor device in the event of the match fail caused.

Moreover, the sequence control unit may further include a fail-burst processing unit for performing a fail-burst process which stops an output of the address signal and repeatedly supplies the same input signal pattern to the semiconductor device in the event of the match fail caused.

Moreover, the pattern generator may further include a mode selector which selects one among any of a plurality of processes including the fail-hold process and fail-burst process in the event of the match fail caused.

Moreover, the pattern generator may further include a mode register which sets to select a process of said plurality of processes in the event of the match fail caused. Preferably, the mode selector selects a single process among the plurality of processes based on a setting set by the mode register.

Moreover, the semiconductor device testing apparatus may further comprise: a timing generator which generates a timing signal that controls a timing of supplying the input signal pattern to the semiconductor device a waveform shaper which shapes a waveform of the input signal based on the timing signal. Preferably, the fail-hold processing unit stops an input of the input signal pattern to the semiconductor device by stopping the timing signal.

Moreover, the fail-burst processing unit outputs continuously the timing signal, so that the same input signal pattern is repeatedly input to the semiconductor device.

Moreover, the semiconductor device testing apparatus may further comprise: a plurality of semiconductor device contact portions which respectively place a plurality of the semiconductor devices thereon, respectively receive the input signal pattern so as to be supplied to a plurality of the semiconductor devices, and respectively receive the output signal output from a plurality of the semiconductor devices. Preferably, the comparison unit compares each of the output signal patterns output from a plurality of the semiconductor devices with the expectation data signal pattern so as to output the match signal.

According to another aspect of the present invention, there is provided a semiconductor device testing method of testing a semiconductor device, comprising: generating, in accordance with a predetermined control sequence, an input signal pattern to be supplied to the semiconductor device, and an expectation data signal pattern to be output from the semiconductor device after the input signal pattern having been input to the semiconductor device; outputting a match signal in the event that an output signal pattern to be output from the semiconductor device is compared to the expectation signal pattern so that the output signal pattern is matched with a desired value determined based on the expectation data signal pattern; stopping the control sequence in the event that a match fail in which the match signal does not become active during a predetermined match cycle is caused; storing a re-start address which indicates a resuming position of the control sequence; and resuming the control sequence based on the re-start address.

Moreover, the semiconductor device testing method may further comprise: performing a fail-hold process by which to stop the control sequence and an input of the input signal pattern to the semiconductor device in the event that the match fail is caused.

Moreover, the semiconductor device testing method may further comprise: performing a fail-burst process by which to stop the control sequence and to repeatedly input the same input signal pattern to the semiconductor device in the event that the match fail is caused.

This summary of the invention does not necessarily describe all necessary features so that the invention may also be a sub-combination.of these described features.

BRIEF DESCRIPTION OF THE DRAWINGS

FIG. 11A shows the control sequence of the sequence control unit 40 while FIG. 11B shows data stored in the pattern data memory 50, so that the control sequences of the sequence control unit 40 are indicated in correspondence to the input signal pattern and expectation data signal pattern stored in the pattern data memory 50.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
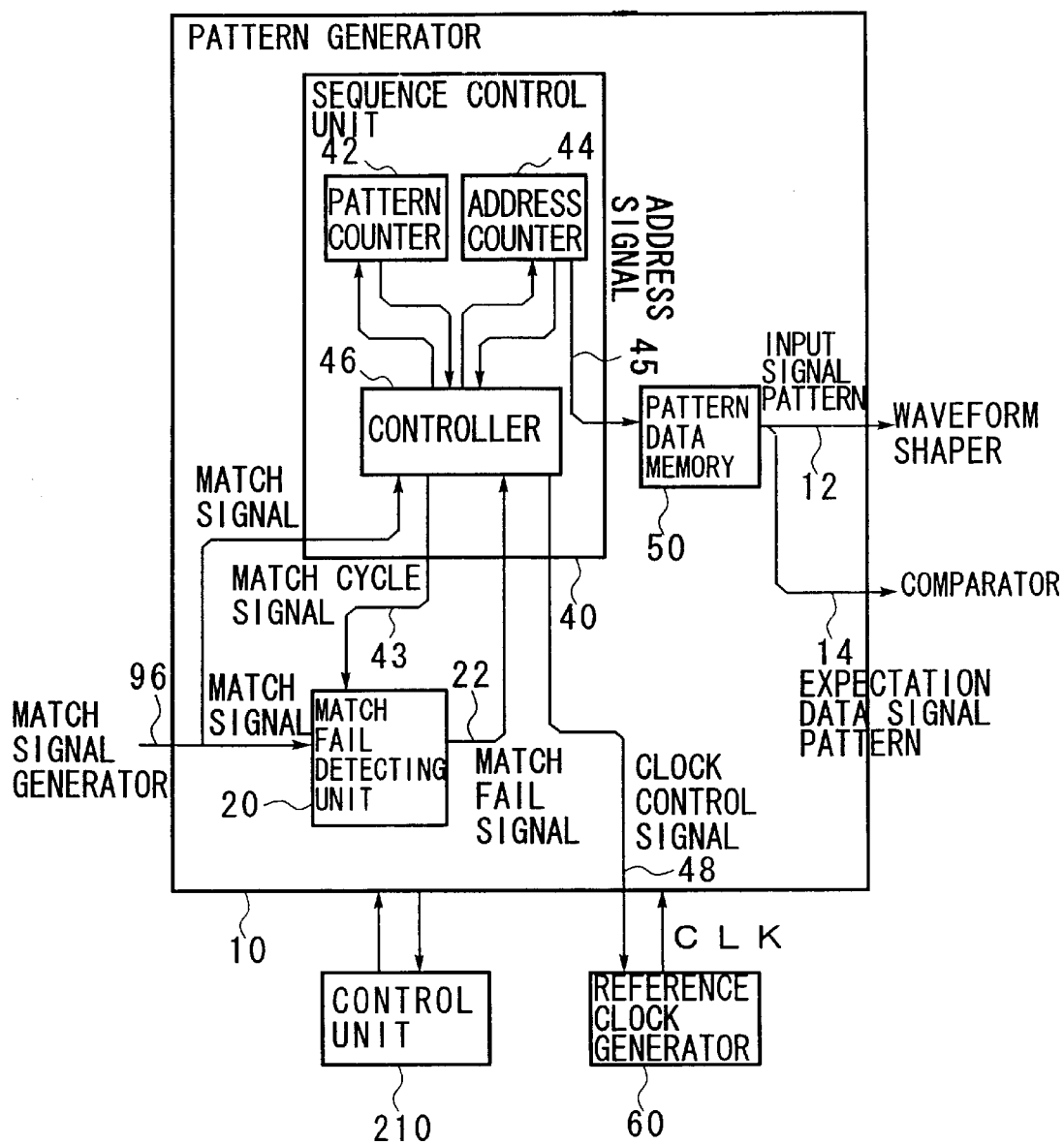
FIG. 1 is a block diagram showing the structure of a pattern generator 10 in a typical semiconductor device testing apparatus.
Figure 2:
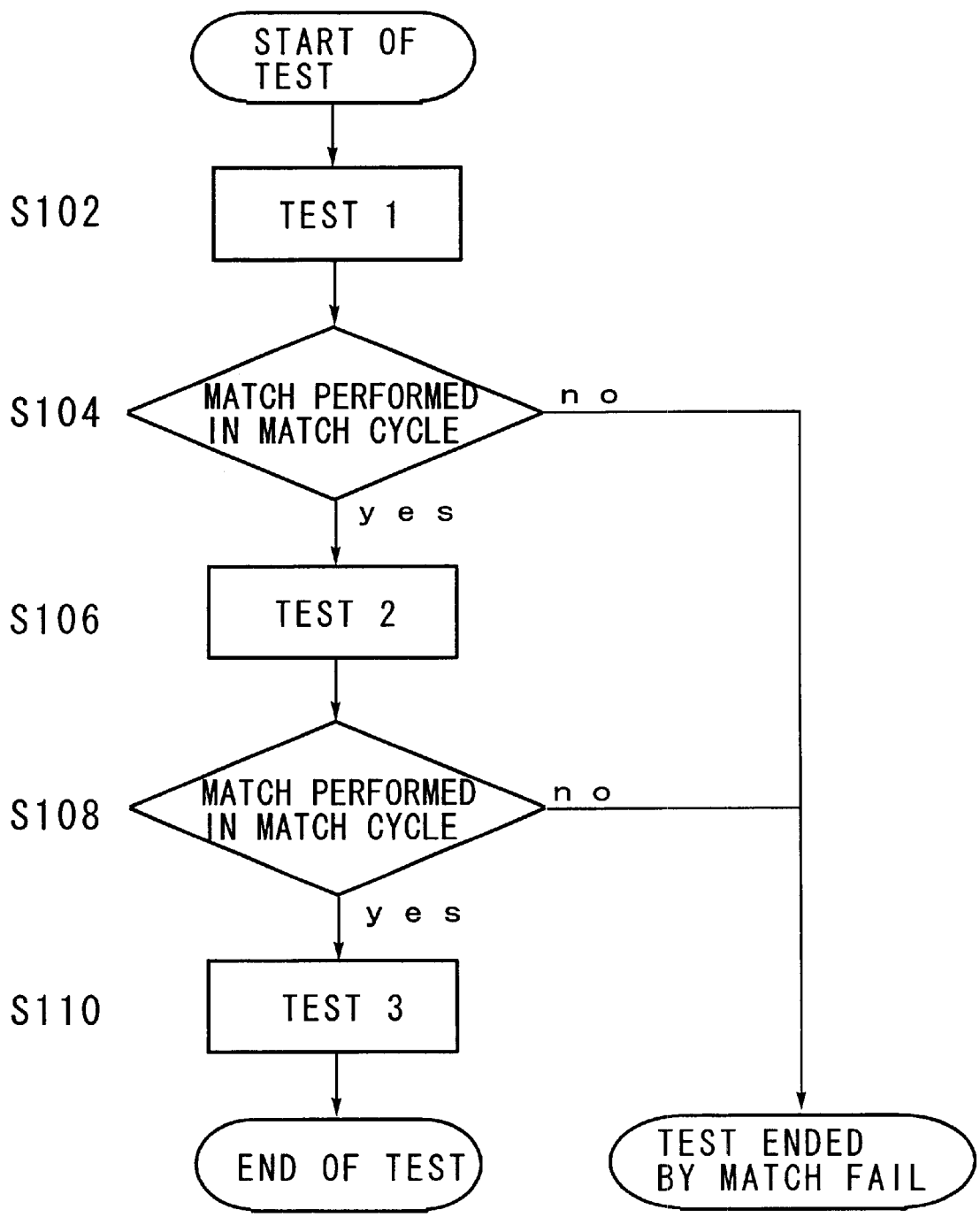
FIG. 2 is a flow chart showing a process of testing a single semiconductor device using the conventional semiconductor device testing apparatus.
Figure 3:
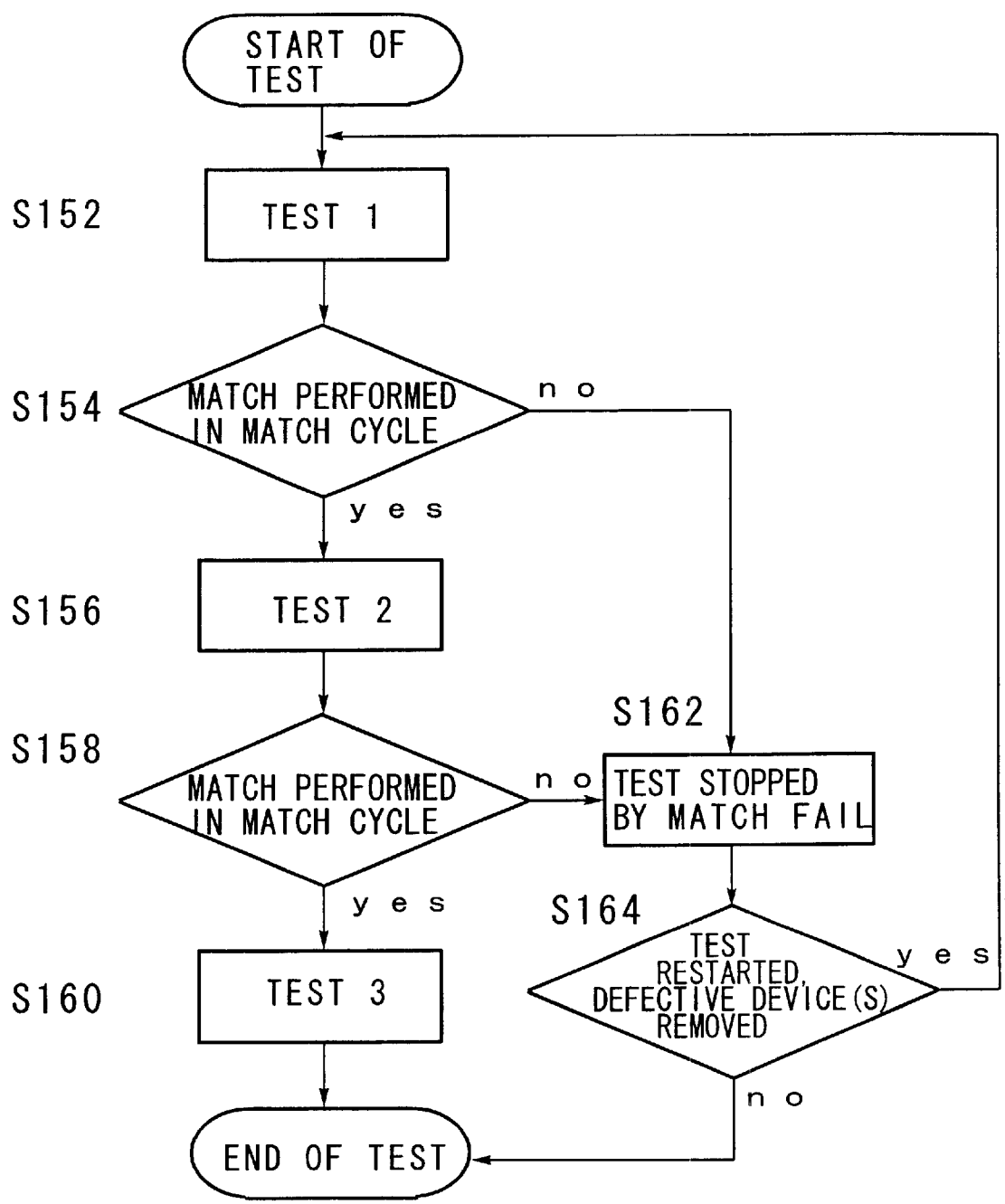
FIG. 3 is a flow chart showing a process simultaneously testing a plurality of semiconductor devices using the conventional semiconductor device testing apparatus.
Figure 4:
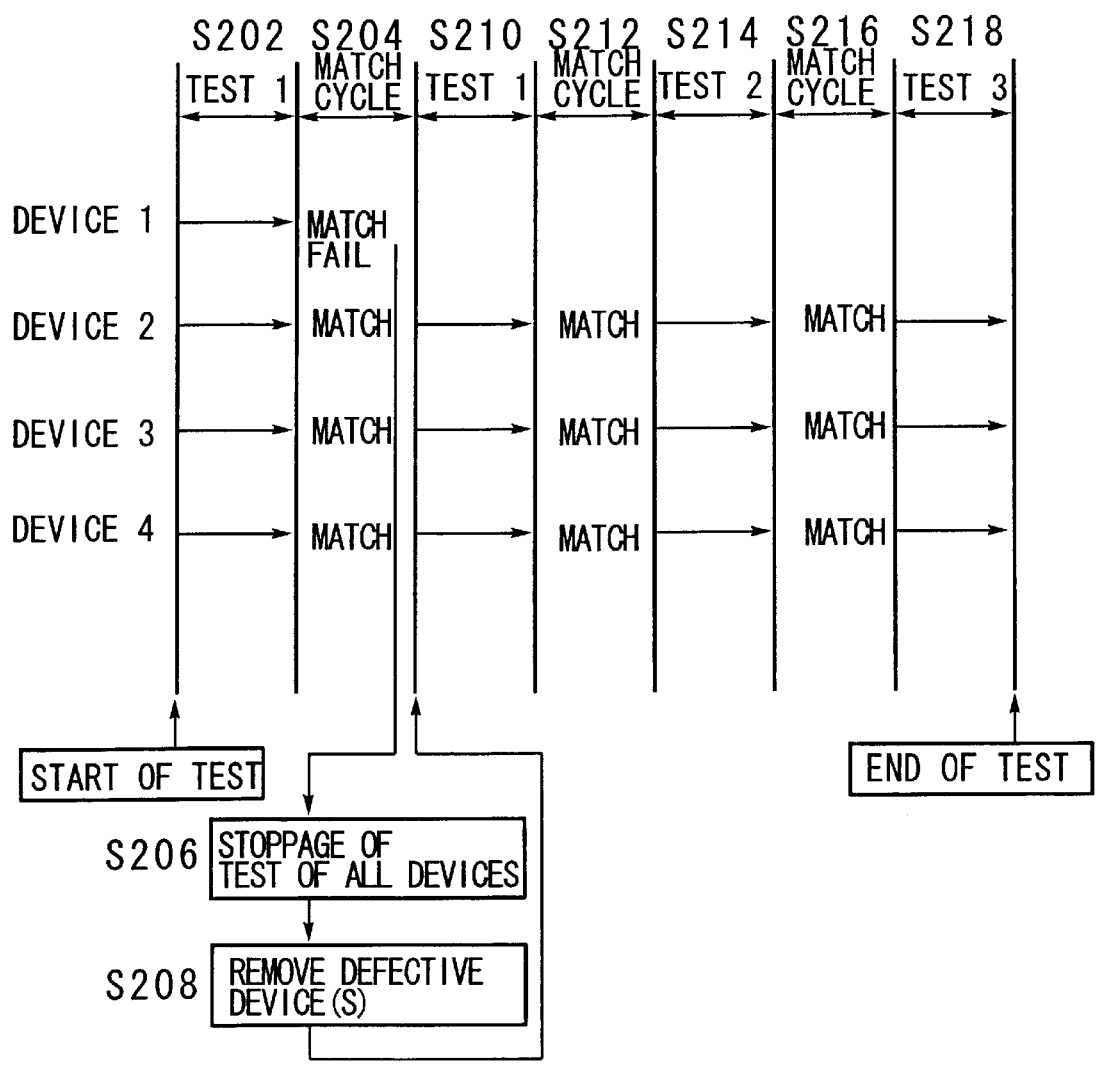
FIG. 4 is a timing chart of an example compared to the present embodiment, showing a process for simultaneously testing a plurality of semiconductor devices using the semiconductor device testing apparatus.
Figure 5:
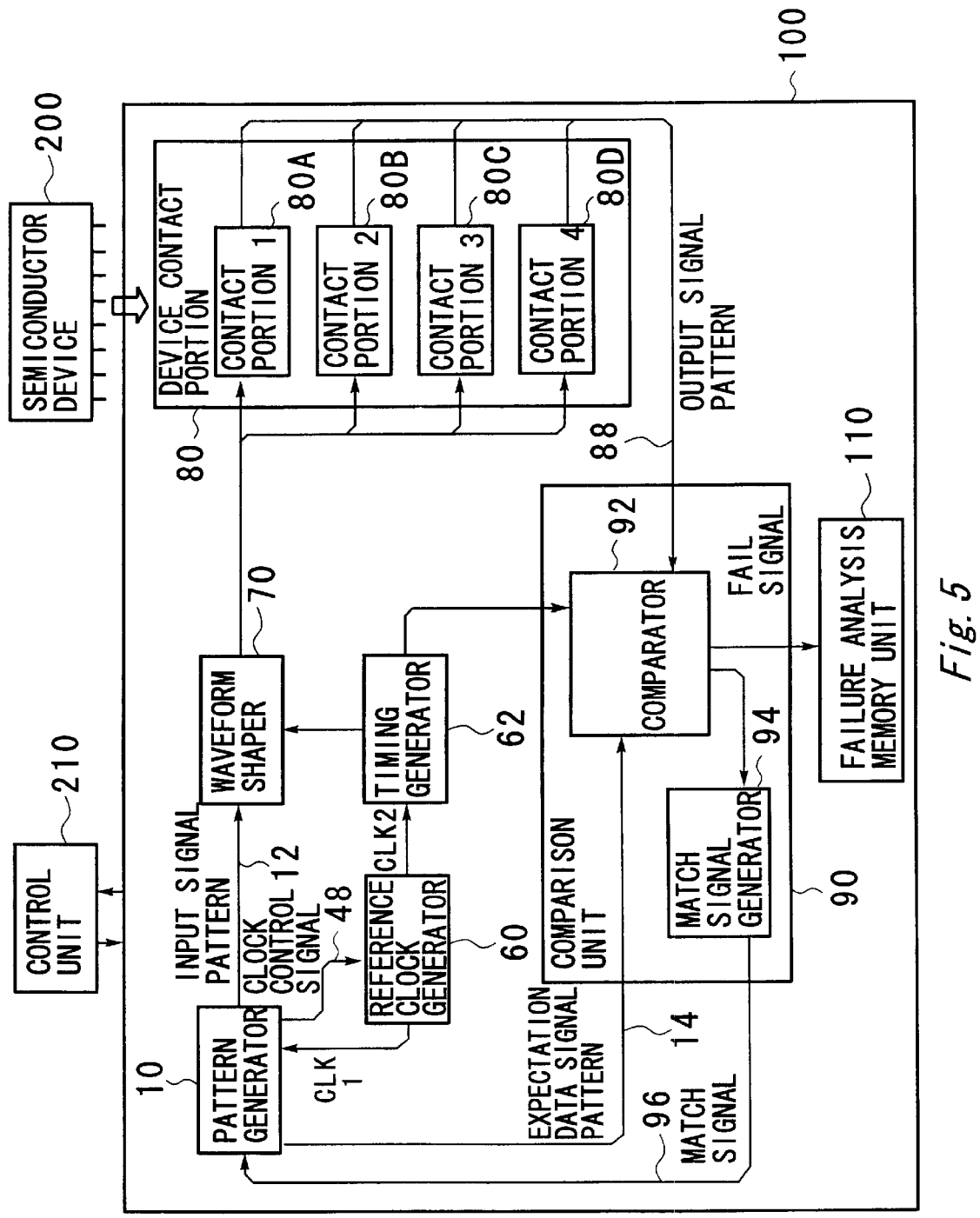
FIG. 5 is a block diagram showing an overall configuration of a semiconductor device testing apparatus.

FIG. 5 is a block diagram showing an overall configuration of a semiconductor device testing apparatus. The semiconductor device testing apparatus 100 comprises: a pattern generator 10; a reference clock generator 60; a timing generator 62; a waveform shaper 70; a device contact portion 80; a comparison unit 90; and a failure analysis memory unit 110.

The semiconductor device testing apparatus 100 is used for testing logic ICs such as a system LSI, and in particular a plurality of semiconductor devices 200 can be simultaneously tested. When the system LSI has a built-in flash memory, a testing pattern need be input continuously for a predetermined number of time. This is due to a characteristic of the flash memory such that data can not be written unless the data are input for the predetermined number of time. Though the number of inputting time necessary for the write depends on the standard of the flash memories, the number of time set according to the standard is usually set higher than the necessary number of inputting time. For instance, through there is a flash memory in which data can be written for the number of approximately 20 inputs, the standard may state 100.

When a plurality of such the flash memories are simultaneously tested, the number of inputting time is set to 20 in order to reduce the testing time. Then, a flash memory having failed in the write is removed from the testing objects and the test of the remaining flash memories continues. The flash memory removed from the testing objects may be separately tested with the number of inputting time being set to 30 for example.

Thus, in the simultaneous test of a plurality of semiconductor devices 200, the test is performed while confirming whether or not the write of an input signal pattern 12 and the readout of an output signal pattern 88 are completed in a normal manner. Thus, a series of several different types of testing procedures are divided accordingly and the completion of the read-write of each semiconductor device 200 are confirmed during a fixed period of time between these testing procedures called the match cycle (this is called a match performance). When the match is not performed during the match cycle, it means that at least one of the plural semiconductor devices under test is defective, so that the defective device is removed from the test after the test is stopped and thereafter the test will be resumed.

The pattern generator 10 generates, according to a predetermined control sequence, an input signal pattern that is to be input to a semiconductor device 200 under test, and an expectation data pattern 14 that is expected to be output from the semiconductor device 200 in the event that the input signal pattern 12 is input to the semiconductor device. The reference clock generator 60 outputs to the pattern generator 10 and the timing generator 62 respectively a clock signal CLK1 and a clock signal CLK2. Moreover, the reference clock generator 60 is controlled based on a clock control signal 48 output from the pattern generator 10. Based on the clock signal CLK2, the timing generator 62 generates the timing signal, at various timings, which controls the inputting timing of the input signal pattern 12 fed to the semiconductor device 200.

Based on the respective timing signals, the waveform shaper 70 shapes a waveform of the input signal pattern 12 so as to be complied with the characteristics of the respective semiconductor devices 200. Moreover, the waveform shaper 70 controls, based on the timing signal, the inputting of the input signal pattern 12 to the semiconductor device 200.

When the clock control signal 48 is output to the reference clock generator 60 from the pattern generator 10, the output of the clock signal CLK2 from the reference clock generator 60 to the timing generator 62 is stopped. At the same time, the output of the timing signal from the timing generator 62 is also stopped. Then, the input of the input signal pattern 12 to the semiconductor device 200 is stopped by controlling the waveform shaper 70.

In the present embodiment, four contact portions 80A, 80B, 80C and 80D are provided in a device contact portion 80 so that each semiconductor device 200 is placed on each contact portion. The respective device contact portions 80A, 80B, 80C and 80D receive the waveform-shaped input signal patterns and input these to respective input pins of the semiconductor devices 200, and the contact portions receive respective output signal patterns from the output pins of respective semiconductor devices 200 and output them to a comparator 92 of the comparison unit 90.

Though in this embodiment there are four contact portions 80A, 80B, 80C and 80D so as to test simultaneously these four semiconductor devices, there may be provided a plurality of contact portions and devices more than four. Moreover, besides a plurality of semiconductor devices 200, a single semiconductor device may be tested as well.

The comparison unit 90 receives the output signal pattern 88 and the expectation signal pattern 14 and logic-compares them based on the timing signal output from the timing generator 62, and outputs a match signal 96 if the output signal pattern 88 matches a desired value determined based on the output signal pattern 88 and the expectation signal pattern 14.

The comparison unit 90 comprises a comparator 92 and a match signal generator 94. The comparator 91 includes an exclusive OR circuit which receives the output signal pattern 80 and the expectation data signal pattern 14 and performs logical comparison on them based on the timing signal output from the timing generator 62. Each output signal pattern 88 output from each semiconductor device 200 contains a 1-bit match bit which indicates that either the write of the input signal pattern 12 or the readout of the output signal pattern 88 has been completed in the normal manner. A particular bit location of the match bit in the output signal pattern 88 depends on a type of the test and the semiconductor device 200 itself, and it is judged by the comparator based on the expectation signal pattern 14.

The comparator 92 outputs to the match signal generator 94 a signal indicating whether or not each match bit contained in each output signal pattern 88 does match a desired vale determined based on the expectation data signal pattern 14. The match signal generator 94 outputs the 1-bit match signal if the match bits of all output signal patterns 88 matches the desired value.

Though the 1-bit match signal is output relative to all the output signal patterns 88 in the present embodiment, one bit may be output for each output signal pattern 88.

When the output signal pattern 88 does not match the expectation data signal pattern 14 (that is, it becomes a fail) the comparator 92 outputs a fail signal to a failure analysis memory unit 110. The fail signal is stored in the failure analysis memory unit 110, so that a particular location of a defect and a semiconductor device having the defect itself are analyzed based on the stored fail signal. Each component of the semiconductor device testing apparatus 100 is controlled by a control unit 210.

Figure 6:
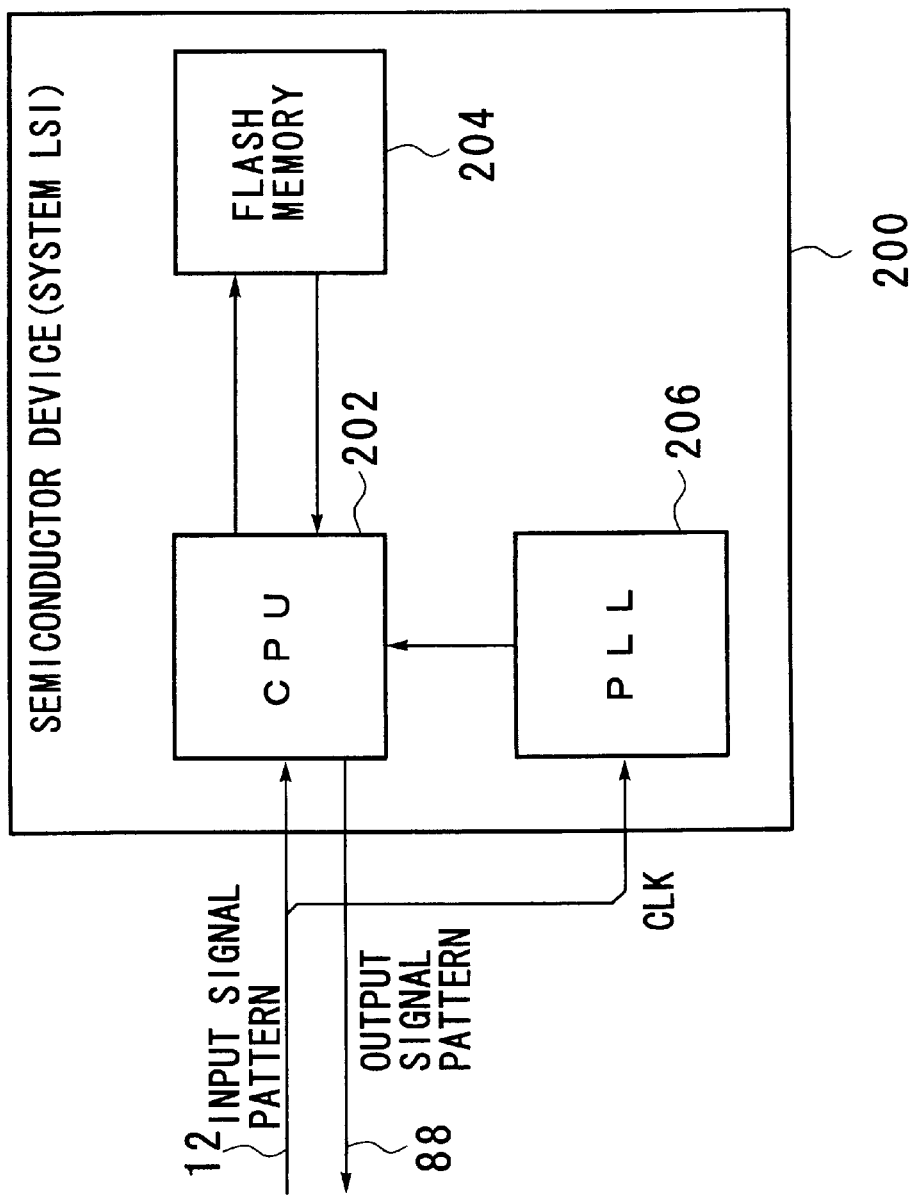
FIG. 6 shows a system LSI as an example of the semiconductor device 200 serving as a testing object.

FIG. 6 shows a system LSI as an example of the semiconductor device 200 serving as a testing object. There is available the system LSI having a built-in flash memory and PLL device. In this embodiment, the semiconductor device 200 has built-in CPU 202, flash memory 204 and PLL device 206.

Since the data can not be directly written to and read out of the flash memory 204 built in the system LSI, a CPU control signal is fed to the CPU 202 so as to input the input signal pattern 12 to the flash memory 204, thereby, the output signal pattern 88 is output. When the test of the system LSI having the built-in flash memory 204 is interrupted and stopped in the midst of the test and then the test is resumed from the beginning, the overlapped input signal patterns 12 are input so as to cause the excessive write of the data. However, the excessive write of data may damage and eventually destroy the flash memory 204. Thus, when resuming the test after the test of the flash memory built-in LSI system has been once stopped, the test need be resumed from the very point at which the test was interrupted then.

Therefore, as will be described in detail later, in the present embodiment, data on a resuming address (re-start address) are stored, and then the test can be resumed, based on the data, from the -point at which the test was stopped.

Moreover, when the system LSI having the built-in PLL 206 is tested, the PLL device 206 need be locked in advance by inputting the clock signal prior to the test. Thus, whenever the test is stopped in the midst and the clock signal is also interrupted, the clock signal need be input again and one has to wait until the PLL device 206 locks.

In view of this drawback, the present embodiment realizes that even if the test is stopped in the midst, the clock signal continues to be input, so that the test can be resumed without waiting for the PLL device 206 to lock.

Figure 7:
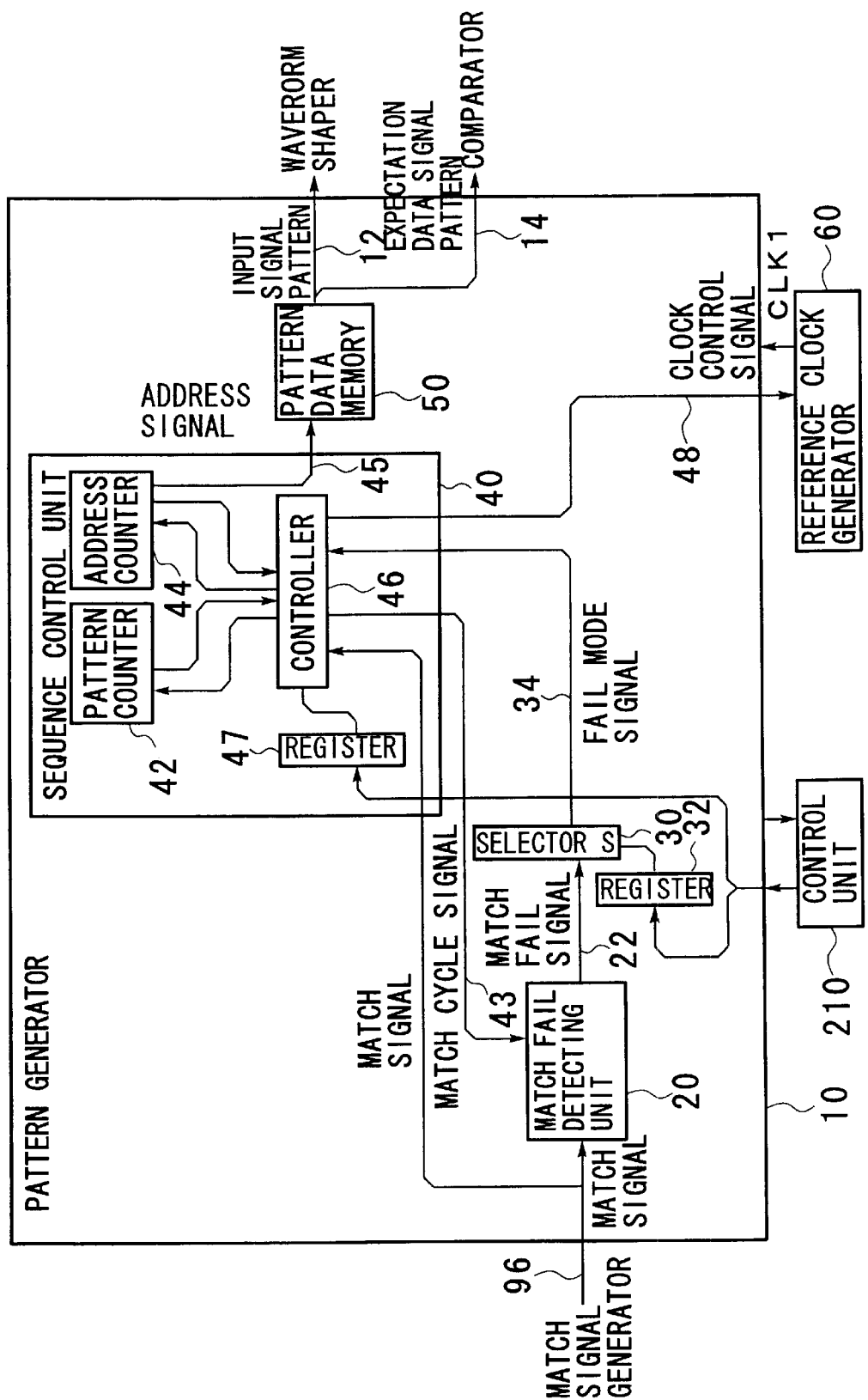
FIG. 7 shows a structure of the pattern generator 10 according to the present embodiment.

FIG. 7 shows a structure of the pattern generator 10 according to the present embodiment. The pattern generator 10 comprises a sequence control unit 40, a pattern data memory 50, a match-fail detecting unit 20, fail-mode selector 30 and fail-mode register 32.

The pattern data memory 50 stores the data of the input signal pattern 12 and the expectation data signal pattern 14. The sequence control unit 40 outputs the address signal to the pattern data memory 40, so that the input signal pattern 12 and the expectation data signal pattern 14 are generated from the pattern data memory 50. Moreover, the sequence control unit 40 receives the match signal 96 from the match signal generator 94. The match-fail detecting unit 20 outputs the match-fail signal 22 when the match signal 96 does not become active during the match cycle waiting for the match signal 96. Upon receipt of the match-fail signal 22 from the match-fail detecting unit 20, the fail-mode selector 30 (simply labeled selector 30 in FIG. 7) outputs, based on a preset value of the fail-mode register 32 (simply labeled register in FIG. 7), the fail-mode signal 34 which indicates a control command for the sequence control unit 40 at the time of the match fail.

The sequence control unit 40 comprises a pattern counter 42, an address counter 44, a controller 46 and resuming address register (re-start address register) 47.

The pattern counter 42 counts the match cycle while the address counter 44 counts the address of the control sequence. The controller 46 controls the pattern counter 42 and the address counter 44 according to a predetermined control sequence. Moreover, the controller 46 outputs to the match fail detecting unit 20 a match cycle signal 43 indicating of being in the midst of the match cycle, and receives the match-fail signal 22 from the match-fail detecting unit 20. Moreover, the controller 46 to the reference clock generator 60 outputs, based on the match-fail signal 22, the clock control signal 48 which serves to stop generation of clock signal by the reference clock generator 60. A resuming address which functions to resume the once stopped control sequence is set to the resuming address register 47. In the present embodiment, an address next to the address serving to stop the test is set as the resuming address in the resuming address register 47.

As a method of processing the control sequence from the sequence control unit 40 in the event that the match-fail occurs, there are (1) a fail-stop process which terminates the test; (2) fail-hold process which resumes the test from the resuming address after the test is stopped; and (3) a fail-burst process in which the same input signal patter 12 is repeatedly input to the semiconductor device 200 while the test is being stopped. The fail-mode register 32 stores data on which one to select among the fail-stop process, fail-hold process and fail-burst process in the event of the match fail.

In the fail-stop process, generation of the address signal 45 is stopped such that the controller 46 controls the address counter 44 when the match-fail occurs. Thereby, generation of the input signal pattern 12 and expectation data signal pattern 14 is stopped, and the clock control signal 48 is output to the reference clock generator 60, thus stopping the input of the input signal pattern 12 to the semiconductor device 200. In this case, in order to resume the once stopped test, test must be started from the beginning.

In the fail-hold process, similar to the above fail-stop process, generation of the address signal 45 is stopped and the clock control signal 48 is output. However, when resuming the stopped test, the control sequence is resumed from the resuming address set by the resuming address register 47. Thus, the testing time can be reduced, moreover, no overlapped input signal pattern 12 will be input to the semiconductor device 200, thus not damaging nor destroying the flash memory 204 built in the system LSI.

In the fail-burst process, when the match-fail occurs, output of the address signal 45 is stopped and generation of the input signal pattern 12 and expectation data signal pattern 14 is stopped. Moreover, the same input signal pattern 12 is repeatedly input to the semiconductor device 200. Namely, since the controller 46 does not output the clock control signal 48, the timing generator 62 which receives the clock signal CLK2 from the reference clock generator 60 continues to output the timing signal. The waveform shaper 70 which receives this timing signal inputs repeatedly the same input signal pattern 12 to the semiconductor device 200. When resuming the stopped test, the control sequence is resumed from the resuming address set in the resuming address register 47. Thus, even when the test of the system LSI with the built-in PLL device 206 is stopped, the clock signal continues to be input thereto. Thus, there is no need to wait for the PLL device 206 to lock in the event of resuming the test, thereby the testing time can be reduced.

Figure 8:
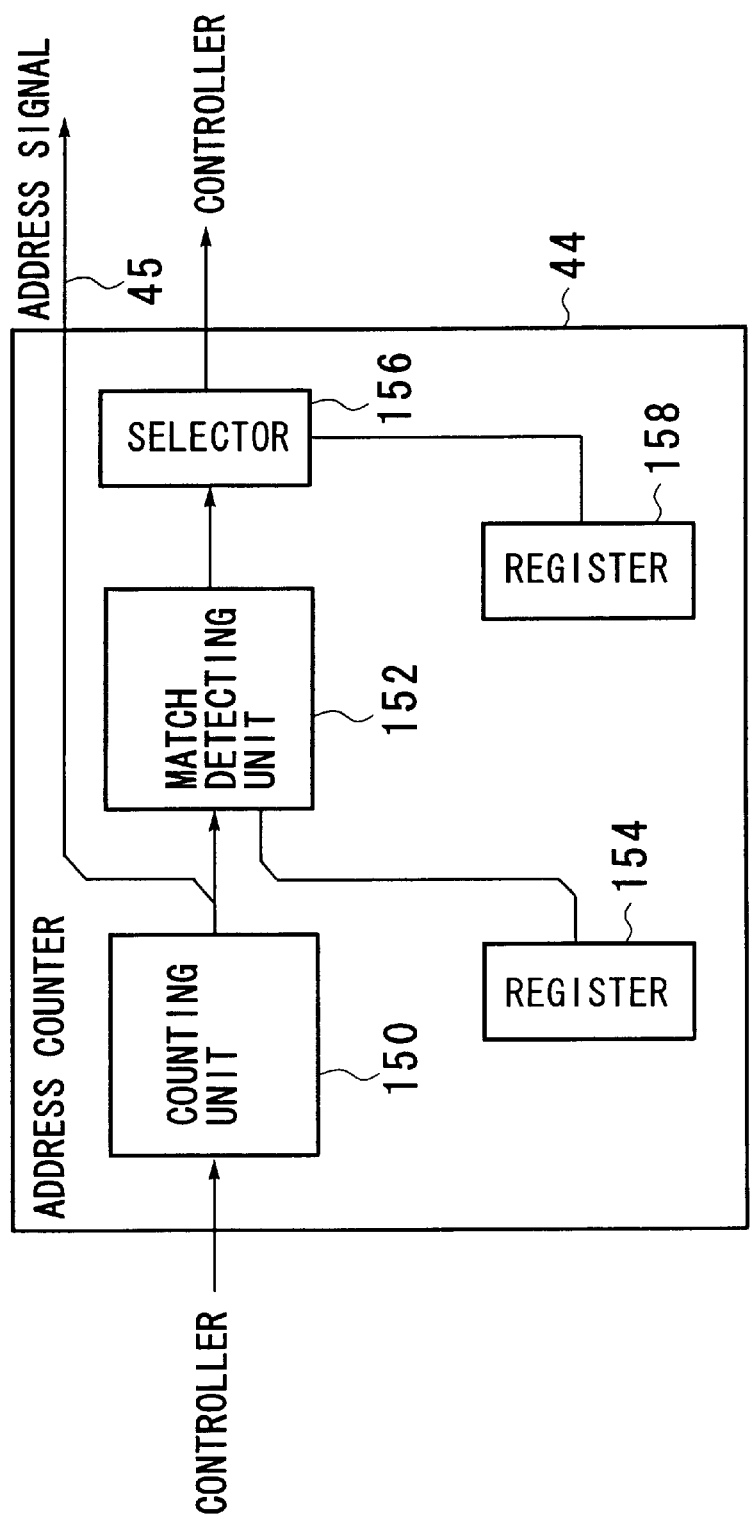
FIG. 8 shows the inner structure of the address counter 44.

FIG. 8 shows the inner structure of the address counter 44. The address counter 44 comprises a counting unit 150, a match detecting unit 152, a register for use in detecting the match 154, a mode selector 156 and a mode register 158.

The address counter 44 is mainly used for a DC parametric test which measures a current-voltage characteristic of the semiconductor device 200. The current-voltage characteristic of the semiconductor device 200 is measured by varying the current or voltage after a to-be-measured pin of the semiconductor device 200 is set to a desired state. In order to set the to-be-measured pin of the semiconductor device 200 to the desired state, the control sequence which inputs the input signal pattern 12 to the semiconductor device 200 is forwarded so as to be stopped at an address achieving the desired state.

The counting unit 150 counts the address of the control sequence in the sequence control unit 40, and outputs the address signal to the match detecting unit 152. Moreover, the counting unit 150 outputs the address signal 45 to the pattern data memory 50. The address of the control sequence at which the to-be-measured pin of the semiconductor device 200 becomes a desired state is set in the register for use in detecting the match 154. The match detecting unit 152 compares the address signal received from the counting unit 150 and the address set in the register for use in detecting the match 154 and, outputs the match signal if those are matched. The mode selector 156 having received the match signal outputs, based on a value set in the mode register 158, the control signal to the controller 46.

In the mode register 158, as a method of controlling the control sequence by the controller 46, a processing sequence is set from one among (1) a stop process which terminates the control sequence, (2) a hold process which resumes from an address next to the address that stopped the control sequence, and (3) a burst process which stops the control sequence and repeatedly inputs the same input signal pattern 12.

In the stop process (1), the output of the address signal 45 by the counting unit 159 is stopped and the clock control signal 48 from the controller 46 is output, so that the generation of the input signal pattern 12 and the expectation data signal pattern 14 is stopped, and the input of the input signal pattern 12 to the semiconductor device 200 is stopped. When resuming the control sequence, the control sequence is re-started from the first sequence.

In the hold process (2), the output of the address signal 45 by the counting unit 150 is stopped, and the clock control signal 48 is output from the controller 46, so that the generation of the input signal pattern 12 and the expectation data signal pattern 14 is stopped, and the input of the input signal pattern 12 to the semiconductor device 200 is stopped. When resuming the control sequence, the control sequence is resumed from the address next to the address set in the register for use in detecting the match 154. Therefore, the testing time can be reduced and no overlapped input signal pattern 12 is input to the semiconductor device 200, thus not damaging nor destroying the system LSI with the built-in flash memory 204.

In the burst process (3), the output of the address signal 45 by the counting unit 150 is stopped, and the same input signal pattern 12 is repeatedly input to the semiconductor device 200. When resuming the control sequence, the control sequence is resumed from the address next to the address set in the register for use in detecting the match 154. Therefore, even when the test of the system LSI having the built-in PLL device therein is stopped, the clock signal continues to be input. Thereby, there is no need to wait for the PLL device 206 to lock prior to the actual re-start of the test, thus reducing the testing time.

Compared to the structure of the address counter 44 shown in FIG. 8, the pattern counter 42 has a similar structure to that of the address counter 44, except that in the address counter 44 the counting unit 150 outputs the address signal 45 to the pattern data memory 50. When counting a pattern, the pattern counter 42 processes the control sequence in a similar manner as the address counter 44 does.

Figure 9:
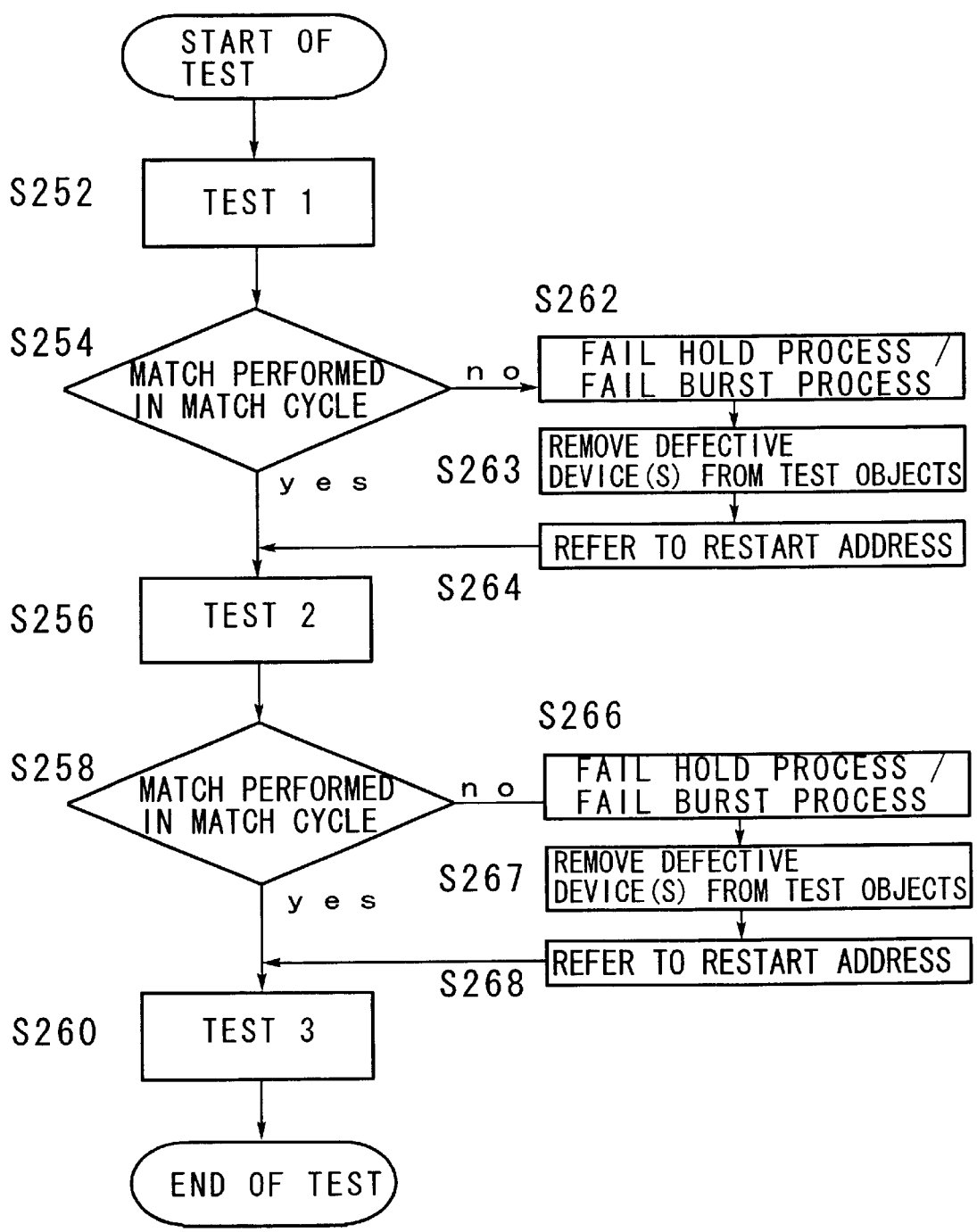
FIG. 9 is a flow chart showing a process of simultaneously testing a plurality of semiconductors 200.

FIG. 9 is a flow chart showing a process of simultaneously testing a plurality of semiconductors 200. When the match is performed in the match cycle S254 after the test 1 (S252) is performed, the test 2 is performed continuously thereafter.

When the match is not performed in the match cycle (S254), the test is stopped at once as a match-fail (S262), an address next to a stoppage address is set to the resuming address register 47 as a resuming address. The fail-mode selector 30 selects one processing sequence (S262) among the fail-stop process, the fail-hold process and the fail-burst process, based on a value set in the fail-mode register 32. Semiconductor(s) indicated as the match-fail is (are) removed from the testing objects (S263). Thereafter, when resuming the test for the remaining other semiconductor devices, the resuming address set in the resuming address register 47 is referred to (S264). Based on this resuming address, the test is resumed from the next test 2 (S256).

The similar processes (S266, S267, S268) to those (S254, S262, S263, S264) in the match cycle after the test 1 are performed in the match cycle (S258) after the next test 2 (S256) When the test 3 is performed (S260), all testing processes are completed.

Figure 10:
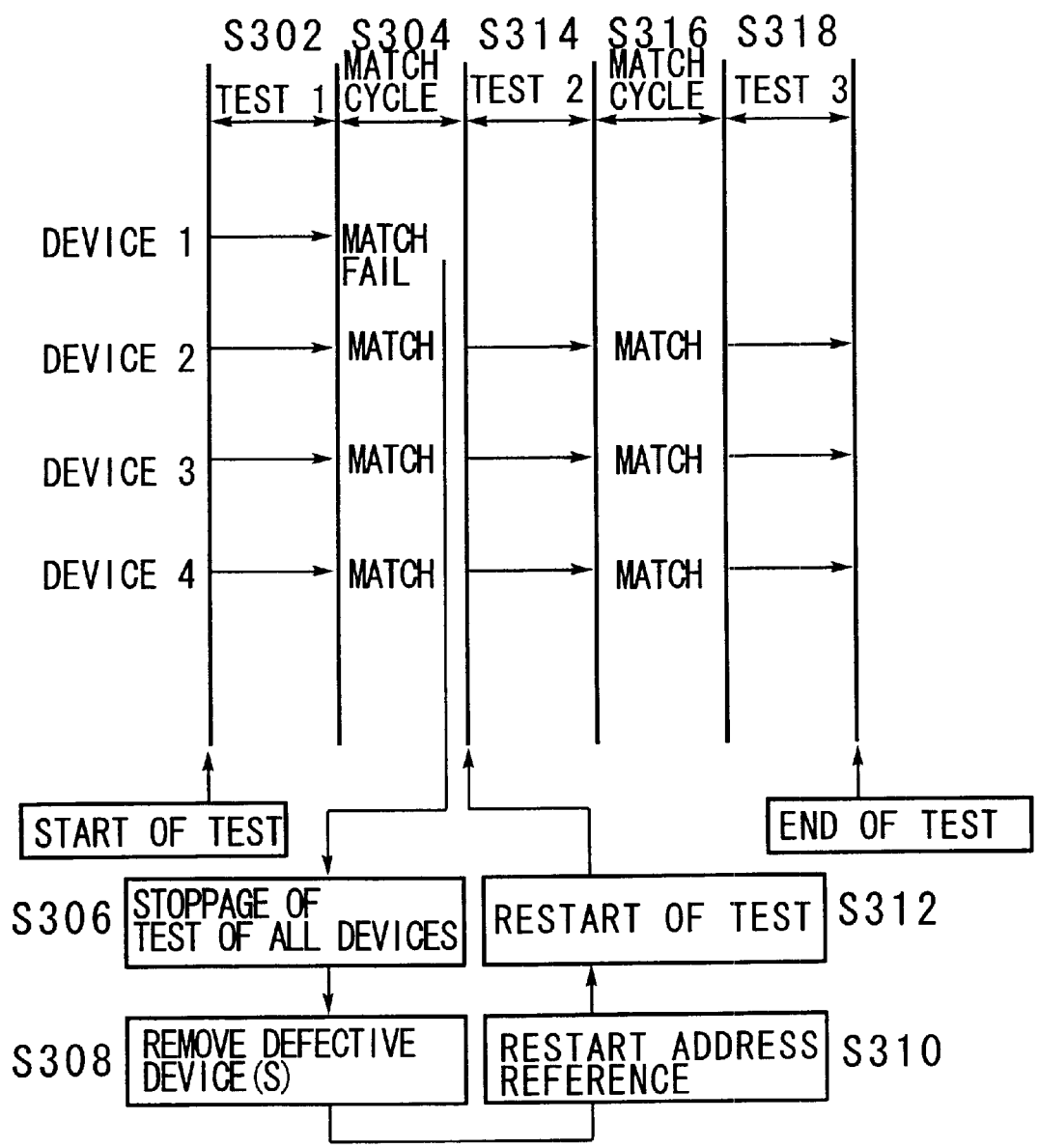
FIG. 10 is a timing chart showing a testing process of simultaneously testing a plurality of semiconductors.

FIG. 10 is a timing chart showing a testing process of simultaneously testing a plurality of semiconductors. After the test 1 (S302), the match is performed on a plurality of semiconductor devices 200 in the predetermined match cycle (S304) When the match-fail occurs in any one of the plural semiconductor devices, the test on all semiconductor devices is stopped at once (S306), an address next to a stoppage address is set to the resuming address register 47 as a resuming address. Semiconductor(s) indicated as the match-fail is (are) removed from the testing objects (S308). Thereafter, when resuming the test for the remaining other semiconductor devices, the resuming address set in the resuming address register 47 is referred to (S310). Based on this resuming address, the test is resumed from the next test 2 (S312).

When no match-fail occurs in the match cycle (S316) after the test 2 (S314), the test 2 (S314) and test 3 (S318) are performed and then all testing processes are completed.

FIG. 11A shows the control sequence of the sequence control unit 40 while FIG. 11B shows data stored in the pattern data memory 50, so that the control sequences of the sequence control unit 40 are indicated in correspondence to the input signal pattern and expectation data signal pattern stored in the pattern data memory 50. 3-bit each of input signal pattern 12 and the expectation data signal pattern 14 is output from each pin 1 through pin 32 of the pattern data memory 50, corresponding to address signal 45 input. The 3-bit data from 000 through 111 indicate, for example, in the following manner:

For example, 001 indicates data 1, 010 a P (that is a positive clock), 011 an N (negative clock), 100 an L (low level), 101 an H (high level), 110 a Z (high zed) and 111 an X (not among the testing objects), and so on.

First, the addresses #0000 to #0020 correspond to the test 1 in which the input signal pattern 12 is input. The addresses from #0021 to #0030 correspond to the match cycle, and there is a loop in which the command is jumped to #0021 at address #0030. In the present embodiment, this loop is repeated 100 times. Referring to FIG. 11B, during this match cycle the match is performed in such a manner that whether or not the predetermined bits of the expectation data signal pattern shown in the right column of FIG. 11B match a predetermined value is judged. When the match is performed (i.e. a match is acknowledged during the match cycle), the address command is jumped to the address #0031. When the match is not performed (i.e., a match is not acknowledged during the match cycle), the test is stopped as a match-fail.

The addresses from #0031 through #0050 correspond to the test 2 which inputs the input signal pattern 12, and the loop in the match cycle from address #0051 to #0060 is repeated 100 times. When the match is performed, the address command is jumped to #0061. When the match is not performed, the test is stopped.

Figure 12:
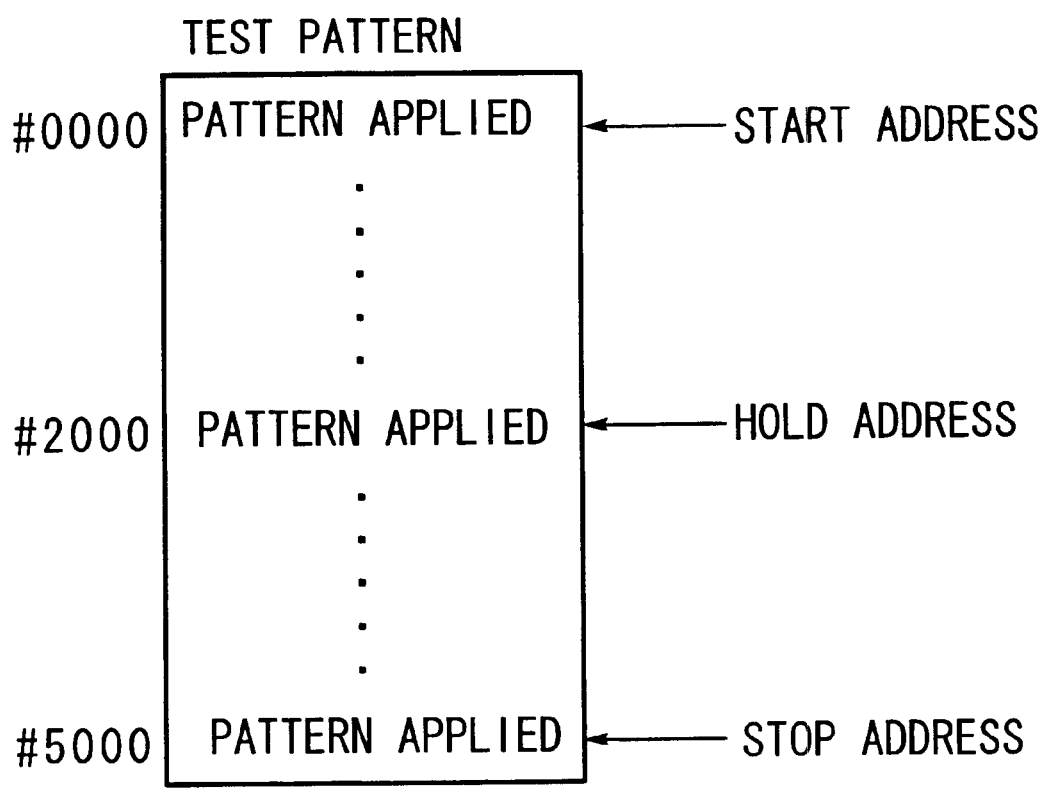
FIG. 12 shows the control sequence of the address counter 44 shown in FIG. 8.

FIG. 12 shows the control sequence of the address counter 44 shown in FIG. 8. For example, when performing the stop process, the address #5000 is set in the register for use in detecting the match 154 as a stoppage address. When performing the hold process or the burst process, the address #2000 is set in the register for use in detecting the match 154 as a hold address or a burst address, respectively.

When the input pattern 12 is first input from the address #0000 and the address #2000 is set as the hold address or burst address, the match detecting unit 152 detects the match with the value set in the register for use in detecting match 154 at the time the control sequence has proceeded through the address #2000. Then, the mode selector 156 outputs a control signal of the hold process or burst process. When the address #5000 is set as the stoppage address, the match detecting unit 152 detects the match with a value set in the register for use in detecting the match 154 at the time the control sequence has proceeded through the address #5000. Then, the mode selector 156 outputs a control signal of stoppage process.

The control sequence of the pattern counter 42 is processed in a similar manner to the control sequence of the address counter 44 shown in FIG. 12.

According to the present embodiment, even if the test of all the semiconductor devices 200 is stopped on account of the occurrence of the match fail in a single semiconductor device 200 during the match cycle while a plurality of semiconductor devices are being simultaneously tested, the semiconductor(s) having caused the match fail is (are) removed from the testing objects and the test of the remaining other semiconductor devices 200 is resumed from an address next to the test stoppage address. Thereby, the total testing time can be reduced.

Moreover, even if the test is once stopped in the midst of the test due to the match fail while the system LSI having the built-in flash memory as the semiconductor device 200 is being tested, the test of the remaining other devices is resumed from an address next to the test stoppage address by performing the fail-hold process. Thereby, the excessive data write to the flash memory can be avoided, thus not damaging nor destroying the device.

Moreover, even if the test is once stopped on account of the match fail during the test while the system LSI having the built-in PLL device as a semiconductor device is being tested, the clock continues to be input to the remaining other semiconductor devices thanks to the fail-burst process. Thus, there is no need to wait for the PLL device to lock whenever resuming the test. Thereby, the total testing time can be significantly reduced.

Figure 13:
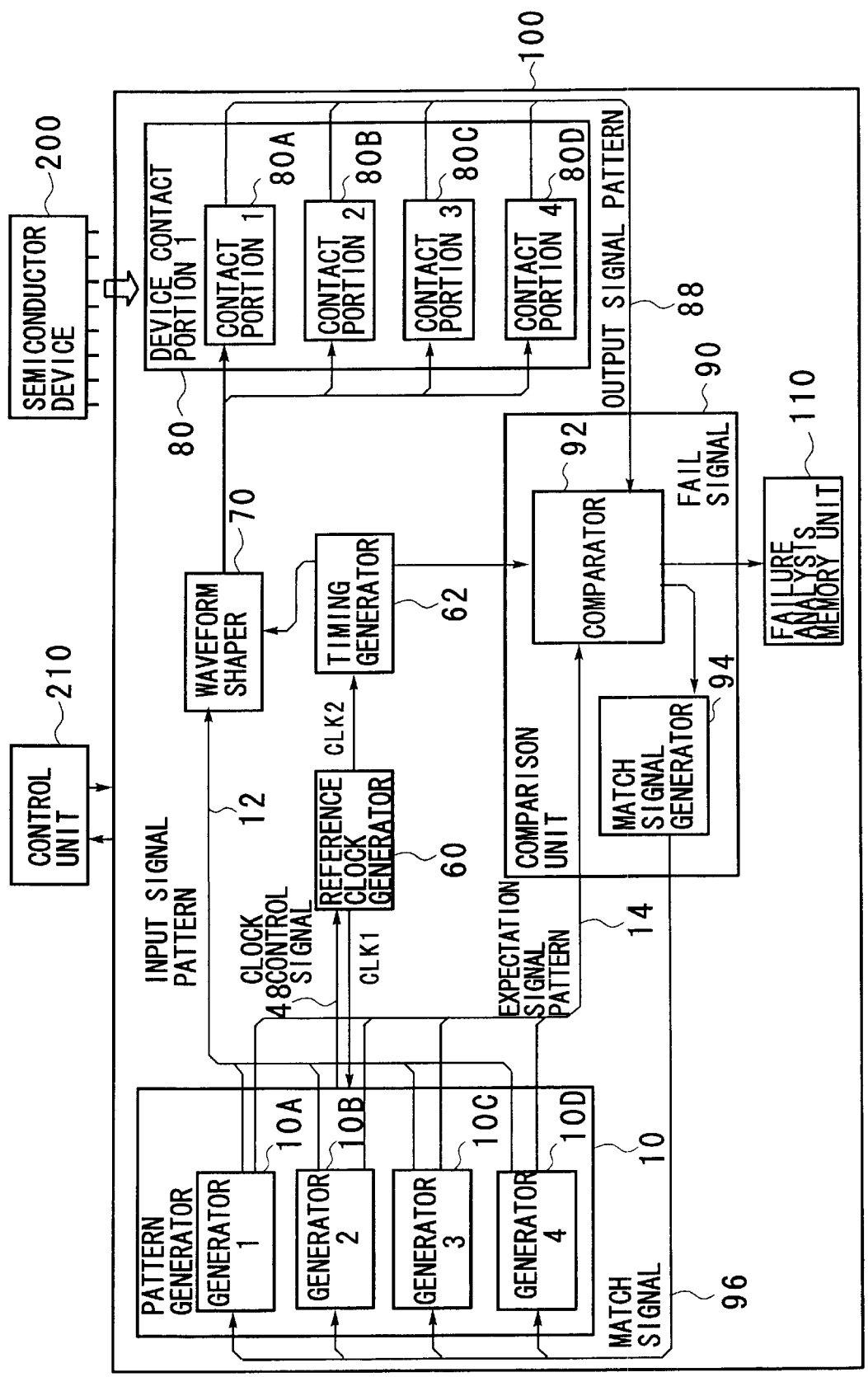
FIG. 13 shows an overall configuration of the semiconductor testing device 100 including a plurality of pattern generators 10.

FIG. 13 shows an overall configuration of the semiconductor testing device 100 including a plurality of pattern generators 10. The semiconductor testing device 100 shown in FIG. 13 differs from that shown FIG. 5 in that there are provided a plurality of pattern generators 10, and thus has a similar structure to that of semiconductor testing.device shown in FIG. 5.

There are provided a plurality of pattern generators 10 whose number corresponds to the number of the device contact portion 80 provided. In the present embodiment, four pattern generators 10A, 10B, 10C and 10D are provided corresponding to device contact portions 80A, 80B, 80C and 80D.

In the present embodiment, the four pattern generators 10A, 10B, 10C and 10D output respectively separate input signal patterns 12 and expectation data signal patterns 14 corresponding the respective semiconductor devices 200 under test.

When any one of the four pattern generators 10A, 10B, 10C and 10D outputs the clock control signal 48, the clock signal to the timing generator 62 is stopped, so that the input of the input signal pattern 12 to all the semiconductor devices 200 is stopped Moreover, a configuration may be such that the comparator 92 input all the output signal patterns 88 to respective pattern generators 10A, 10B, 10C and 10D corresponding to respective semiconductor devices 200, without provision of the match signal generator 94.

By implementing the present embodiment, respectively separate input signal patterns 12 and expectation data signal patterns 14 are output to respective plural semiconductor devices 200, so that a plurality of different types of tests can be simultaneously performed on each of plural semiconductor devices 200.

According to the present embodiments described above, by resuming in an appropriate manner the control sequence of the once stopped test of the semiconductor device or devices, there is no need to re-start the test from the very beginning, thus reducing significantly the total testing time.

Although the present invention has been described by way of exemplary embodiments, it should be understood that many changes and substitutions may be made by those skilled in the art without departing from the spirit and the scope of the present invention which is defined only by the appended claims.

What is claimed is:

1. Semiconductor device testing apparatus for testing simultaneously a plurality of semiconductor devices, comprising:
    a pattern generator which, based on a predetermined control sequence, generates an input signal pattern that is to be input to each of the plurality of the semiconductor devices, and a corresponding expectation data signal pattern that is expected to be output from each of the plurality of the semiconductor devices with the input signal pattern having been input to the plurality of the semiconductor devices;
    a comparison unit which compares an output signal pattern output from each of the plurality of the semiconductor devices and the expectation data signal pattern, and outputs a match signal in the event that the output signal is matched with predetermined data determined based on the expectation data signal pattern;
    said pattern generator including:
        a stoppage unit which stops the control sequence when said output signal pattern output from one of the plurality of semiconductor devices does not match with said corresponding expectation data signal pattern during a predetermined cycle;
        a resuming address register which temporally stores an address indicating where control sequence is stopped; and
        a resuming unit which resumes the control sequence from said address onto the other semiconductor devices.

2. Semiconductor device testing apparatus of claim 1, wherein said pattern generator further comprises:
    a pattern data memory which stores data of the input signal pattern and the expectation data signal pattern; and
    a sequence control unit which generates the input signal pattern and the expectation data signal pattern by supplying an address signal to said pattern data memory, and stops an output of the address signal and thereafter resumes the output of the address signal based on the address set by the resuming address register in the event of a match fail.

3. Semiconductor device testing apparatus of claim 2, wherein said sequence control unit includes a fail-hold processing unit for performing a fail-hold process which stops an output of the address signal and an input of the input signal pattern to each of the plurality of the semiconductor devices in the event of a match fail.

4. Semiconductor device testing apparatus of claim 3, further comprising:
    a timing generator which generators a timing signal that controls a timing of supplying the input signal pattern to each of the plurality of the semiconductor devices; and
    a waveform shaper which shapes a waveform of the input signal based on the timing signal, wherein said fail-hold processing unit stops an input of the input signal pattern to each of the plurality of the semiconductor devices by stopping the timing signal.

5. Semiconductor device testing apparatus for testing a semiconductor device, comprising:
    a pattern generator which, based on a predetermined control sequence, generates an input signal pattern that is to be input to the semiconductor device, and an expectation data signal pattern that is expected to be output from the semiconductor device with the input signal pattern having been input to the semiconductor device, wherein said pattern generator comprises:
        a pattern data memory which stores data of the input signal pattern and the expectation data signal pattern;
        a sequence control unit which generates the input signal pattern and the expectation data signal pattern by supplying an address signal to said pattern data memory, and stops an output of the address signal and thereafter resumes the output of the address signal based on the address set by the resuming address register in the event of a match-fail, wherein said sequence control unit further includes a fail-burst processing unit for performing a fail-burst process which stops an output of the address signal and repeatedly supplies the same input signal pattern to the semiconductor device in the event of the match fail;
    a comparison unit which compares an output signal pattern output from the semiconductor device and the expectation data signal pattern, and outputs a match signal in the event that the output signal is matched with predetermined data determined based on the expectation data signal pattern;
    said pattern generator including:
        a stoppage unit which stops the control sequence when said output signal pattern output from the semiconductor device does not match with said corresponding expectation pattern during a predetermined cycle;
        a resuming address register which temporally stores an address indicating where the control sequence is stopped; and
        a resuming unit which resumes the control sequence based on the address.

6. Semiconductor device testing apparatus of claim 5, said pattern generator further includes a mode selector which selects one among any of a plurality of processes including the fail-hold process and the fail-burst process in the event of the match fail.

7. Semiconductor device testing apparatus of claim 6, said pattern generator further includes a mode register which sets to select a process of said plurality of processes in the event of the match fail caused, and wherein said mode selector selects a single process among said plurality of processes based on a setting set by said mode register.

8. Semiconductor device testing apparatus of claim 5, further comprising:
    a timing generator which generates a timing signal that controls a timing of supplying the input signal pattern to the semiconductor device; and a waveform shaper which shapes a waveform of the input signal based on the timing signal, wherein said fail-burst processing unit outputs continuously the timing signal, so that the same input signal pattern is repeatedly input to the semiconductor device.

9. Semiconductor device testing apparatus for testing a semiconductor device, comprising:

a pattern generator which, based on a predetermined control sequence, generates an input signal pattern that is to be input to the semiconductor device, and an expectation data signal pattern that is expected to be output from the semiconductor device with the input signal pattern having been input to the semiconductor device, wherein said pattern generator comprises:

a pattern data memory which stores data of the input signal pattern and the expectation data signal pattern;

a sequence control unit which generates the input signal pattern and the expectation data signal pattern by supplying an address signal to said pattern data memory, and stops an output of the address signal and thereafter resumes the output of the address signal based on the address set by the resuming address register in the event of a match-fail, wherein said sequence control unit further includes a fail-hold processing unit for performing a fail-hold process which stops an output of the address signal and an input of the input signal pattern to the semiconductor in the event of the match fail;

a mode selector which selects one among any of a plurality of processes including the fail-hold process and a fail-burst process in the event of the match fail;

a comparison unit which compares an output signal pattern output from the semiconductor device and the expectation data signal pattern, and outputs a match signal in the event that the output signal is matched with predetermined data determined based on the expectation data signal pattern;

said pattern generator including:

a stoppage unit which stops the control sequence when said output signal pattern output from the semiconductor device does not match with said corresponding expectation pattern during a predetermined cycle;

a resuming address register which temporally stores an address indicating where the control sequence is stopped; and a resuming unit which resumes the control sequence from said address onto the other semiconductor devices.

10. Semiconductor device testing apparatus of claim 9, said pattern generator further includes a mode register which sets to select a process of said plurality of processes in the event of the match fail, and wherein said mode selector selects a single process among said plurality of processes based on a setting set by said mode register.

11. Semiconductor device testing apparatus of claim 10, further comprising:

a timing generator which generates a timing signal that controls a timing of supplying the input signal pattern to the semiconductor device; and a waveform shaper which shapes a waveform of the input signal based on the timing signal, wherein said fail-burst processing unit outputs continuously the timing signal, so that the same input signal pattern is repeatedly input to the semiconductor device.

12. Semiconductor device testing apparatus of claim 10, further comprising:

a plurality of semiconductor device contact portions which respectively place a plurality of the semiconductor devices thereon, respectively receive the input signal pattern so as to be supplied to a plurality of the semiconductor devices, and respectively receive the output signal output from a plurality of the semiconductor devices, wherein said comparison unit compares each of the output signal patterns output from a plurality of the semiconductor devices with the expectation data signal pattern so as to output the match signal.

13. Semiconductor device testing apparatus of claim 9, further comprising:

a timing generator which generates a timing signal that controls a timing of supplying the input signal pattern to the semiconductor device; and a waveform shaper which shapes a waveform of the input signal based on the timing signal, wherein said fail-hold processing unit stops an input of the input signal pattern to the semiconductor device by stopping the timing signal.

14. Semiconductor device testing apparatus of claim 9, further comprising:

a timing generator which generates a timing signal that controls a timing of supplying the input signal pattern to the semiconductor device; and a waveform shaper which shapes a waveform of the input signal based on the timing signal, wherein said fail-burst processing unit outputs continuously the timing signal, so that the same input signal pattern is repeatedly input to the semiconductor device.

15. Semiconductor device testing apparatus of claim 9, further comprising:

a plurality of semiconductor device contact portions which respectively place a plurality of the semiconductor devices thereon, respectively receive the input signal pattern so as to be supplied to a plurality of the semiconductor devices, and respectively receive the output signal output from a plurality of the semiconductor devices, wherein said comparison unit compares each of the output signal patterns output from a plurality of the semiconductor devices with the expectation data signal pattern so as to output the match signal.

16. A semiconductor device testing method of testing a plurality of semiconductor devices, comprising:

generating, in accordance with a predetermined control sequence, an input signal pattern to be supplied to each of the plurality of the semiconductor devices, and a corresponding expectation data signal pattern to be output from each of the plurality of the semiconductor devices after the input signal pattern having been input to each of the plurality of the semiconductor devices;

outputting a match signal in the event that an output signal pattern to be output from each of the plurality of the semiconductor devices is compared to the expectation signal pattern so that the output signal pattern is matched with a desired value determined based on the expectation data signal pattern;

stopping the control sequence when said output signal pattern output from one of the plurality of the semiconductor devices does not match with said corresponding expectation data signal pattern during a predetermined match cycle;

storing an address which indicates a position of where the control sequence is stopped; and resuming the control sequence from the address onto the other semiconductor devices.

17. A semiconductor device testing method of claim 16, further comprising:

performing a fail-hold process by which to stop the control sequence and an input of the input signal pattern to each of the plurality of the semiconductor devices in the event that the match fail.

18. A semiconductor device testing method of testing a semiconductor device, comprising:

generating, in accordance with a predetermined control sequence, an input signal pattern to be supplied to the semiconductor device, and an expectation data signal pattern to be output from the semiconductor device after the input signal pattern having been input to the semiconductor device;

outputting a match signal in the event that an output signal pattern to be output from the semiconductor device is compared to the expectation signal pattern so that the output signal pattern is matched with a desired value determined based on the expectation data signal pattern;

stopping the control sequence in the event that a match fail when said output signal pattern output from the semiconductor device does not match with said corresponding expectation pattern during a predetermined match cycle;

storing an address which indicates a resuming position of the control sequence;

resuming the control sequence based on the address and;

performing a fail-burst process by which to stop the control sequence and to repeatedly input the same input signal pattern to the semiconductor device in the event of the match fail.

* * * * *